(12) United States Patent
Liang et al.

(10) Patent No.: US 10,096,562 B2
(45) Date of Patent: Oct. 9, 2018

(54) POWER MODULE PACKAGE

(71) Applicant: DELTA ELECTRONICS, INC., Taoyuan (TW)

(72) Inventors: Le Liang, Taoyuan (TW); Kai Lu, Taoyuan (TW); Zhen-Qing Zhao, Taoyuan (TW); Zeng Li, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 15/209,777

(22) Filed: Jul. 14, 2016

(65) Prior Publication Data

US 2017/0025379 A1    Jan. 26, 2017

(30) Foreign Application Priority Data

Jul. 22, 2015    (CN) .......................... 2015 1 0434801

(51) Int. Cl.

| | |
|---|---|
| *H01L 29/15* | (2006.01) |
| *H01L 23/00* | (2006.01) |
| *H01L 23/498* | (2006.01) |
| *H01L 23/31* | (2006.01) |

(Continued)

(52) U.S. Cl.
CPC .......... *H01L 24/16* (2013.01); *H01L 23/3114* (2013.01); *H01L 23/49838* (2013.01); *H01L 25/16* (2013.01); *H01L 25/18* (2013.01); *H01L 2224/16227* (2013.01); *H01L 2924/1033* (2013.01); *H01L 2924/1205* (2013.01);

(Continued)

(58) Field of Classification Search
CPC ........... H01L 25/0652; H01L 23/49838; H01L 24/16; H01L 2224/16227; H01L 2225/06517; H01L 2225/06555; H01L 2225/06572; H01L 2225/06582; H01L 2924/1033; H01L 2225/06589

See application file for complete search history.

(56) References Cited

U.S. PATENT DOCUMENTS 6,477,038 B2 *   11/2002   Iwasaki ................ H05K 1/0373
                                                      361/679.02
2002/0030971 A1    3/2002   Iwasaki et al.

FOREIGN PATENT DOCUMENTS

| CN | 1956193 A | 5/2007 |
|---|---|---|
| CN | 101599474 A | 12/2009 |
| CN | 103857180 A | 6/2014 |

(Continued)

*Primary Examiner* — Elias M Ullah
(74) *Attorney, Agent, or Firm* — CKC & Partners Co., Ltd.

(57) ABSTRACT

A power module package includes a single-layered circuit board, a first electronic component, and a second electronic component. The single-layered circuit board includes an insulating substrate and a conductive layer thereon. A bottom surface of the conductive layer touches a top surface of the insulating substrate. The insulating substrate has plural first openings to allow the conductive layer to be exposed from the bottom surface of the insulating substrate. The first electronic component is disposed on a top surface of the conductive layer. The second electronic component is disposed on the bottom surface of the insulating substrate and received in the first openings. The second electronic component is connected to the conductive layer via the first openings. At least one of the first electronic component and the second electronic component is a bare die.

18 Claims, 10 Drawing Sheets

(51) Int. Cl.
*H01L 25/16* (2006.01)
*H01L 25/18* (2006.01)
(52) U.S. Cl.
CPC ............... *H01L 2924/13091* (2013.01); *H01L 2924/15747* (2013.01)

(56) References Cited

FOREIGN PATENT DOCUMENTS

| CN | 204215381 U | 3/2015 |
|---|---|---|
| TW | 201201332 A | 1/2012 |
| TW | 201434120 A | 9/2014 |

\* cited by examiner

POWER MODULE PACKAGE

RELATED APPLICATIONS

This application claims priority to Chinese Application Serial Number 201510434801.3, filed Jul. 22, 2015, which is herein incorporated by reference.

BACKGROUND

Field of Invention

The present invention relates to a power module package.

Description of Related Art

In order to achieve the objectives of energy saving, cost reduction, and satisfactory service life, high efficiency, high density, and high reliability have been development trends for electronic devices nowadays. Take a power converter as an example, which includes a power module, a driving substrate, heat dissipation fins, and many peripheral electronic components in it. The existing package methods all mount the electronic components in the power converter to the same surface of a circuit board (such as a lead frame, a ceramic substrate, a printed circuit board). Then, dies and some other circuits are connected by wire bonding. However, an inadequacy in such a design is that the switching voltage peak and the switching loss are too high in applications of some high frequency switching power supplies (high power density), thus limiting the switching frequency.

For the forgoing reasons, there is a need to package the electronic components efficiently and to satisfy the requirements of switching frequency and power density by providing a power module package, which is also an objective that the industry is eager to achieve.

SUMMARY

The present invention provides a power module package suitable for a power die. The present invention power module package is based on a single-layered circuit board and electrical connections between two surfaces to improve the power density.

A power module package is provided. The power module package comprises a single-layered circuit board, a first electronic component, and a second electronic component. The single-layered circuit board comprises an insulating substrate and a conductive layer disposed on the insulating substrate. The insulating substrate has a top surface and a bottom surface opposite to each other. The conductive layer has a top surface and a bottom surface opposite to each other. The bottom surface of the conductive layer touches the top surface of the insulating substrate. The insulating substrate has a plurality of first openings to allow the bottom surface of the conductive layer to be exposed from the bottom surface of the insulating substrate. The first electronic component is disposed on the top surface of the conductive layer. The second electronic component is disposed on the bottom surface of the insulating substrate and received in the first openings. The second electronic component is connected to the conductive layer via the first openings. At least one of the first electronic component and the second electronic component is a bare die.

In the foregoing, the bare die is a planar die. The planar die is bonded to the conductive layer in a flip-chip bonding manner.

In the foregoing, the power module package further comprises a third electronic component. The second electronic component is a capacitor. At least one of the first electronic component and the third electronic component is a planar die. The third electronic component is disposed on the top surface of the conductive layer.

In the foregoing, the power module package further comprises two driving components respectively used for driving the first electronic component and the third electronic component. Both the driving components are disposed in the first openings on the bottom surface of the insulating substrate, and orthogonal projections of the driving components onto the insulating substrate respectively overlap orthogonal projections of the first electronic component and the third electronic component onto the insulating substrate.

In the foregoing, the first electronic component and the third electronic component are both gallium nitride dies. Orthogonal projections of the driving components onto the insulating substrate respectively overlap orthogonal projections of source electrodes and gate electrodes of the gallium nitride dies onto the insulating substrate.

In the foregoing, the power module package further comprises a third electronic component, a fourth electronic component, and a fifth electronic component. Each of the first electronic component and the third electronic component is a low voltage metal-oxide-semiconductor transistor disposed on the top surface of the conductive layer. Both the second electronic component and the fourth electronic component are gallium nitride dies disposed on the bottom surface of the insulating substrate. The fifth electronic component is a capacitor disposed on the top surface of the conductive layer. The second electronic component and the fourth electronic component are connected to the conductive layer in the first openings, and orthogonal projections of the low voltage metal-oxide-semiconductor transistors onto the insulating substrate respectively overlap orthogonal projections of source electrodes of the gallium nitride dies corresponding to the low voltage metal-oxide-semiconductor transistors onto the insulating substrate.

In the foregoing, the power module package further comprises two driving components respectively used for driving the low voltage metal-oxide-semiconductor transistors.

In the foregoing, the conductive layer has at least one concave portion. The first electronic component is disposed in the concave portion.

In the foregoing, the first electronic component is a low voltage metal-oxide-semiconductor transistor. The second electronic component is a gallium nitride die. An orthogonal projection of the low voltage metal-oxide-semiconductor transistor onto the insulating substrate overlaps an orthogonal projection of a source electrode of the gallium nitride die onto the insulating substrate.

In the foregoing, the conductive layer is a copper layer.

In the foregoing, the power module package further comprises an encapsulating plastic completely or partially warpping the single-layered circuit board and the first electronic component disposed on the single-layered circuit board.

In the foregoing, a portion of the first electronic component is exposed from the encapsulating plastic. The power module package further comprises a heat dissipation component disposed on the first electronic component.

In the foregoing, the power module package further comprises a heat conductive material disposed between the heat dissipation component and the first electronic component.

In the foregoing, the insulating substrate comprises a plurality of second openings to expose the conductive layer.

The power module package further comprises a plurality of connecting structures disposed in the second openings on the bottom surface of the insulating substrate and are connected to the conductive layer in the second openings.

In the foregoing, the power module package further comprises an isolation layer covering the bottom surface of the insulating substrate. The isolation layer has a plurality of third openings. Each of the first openings and the second openings and the third opening corresponding to the each of the first openings and the second openings communicate with each other vertically.

In the foregoing, the connecting structures are solder balls or pins.

In the foregoing, the power module package further comprises an insulating layer disposed on the conductive layer. The insulating layer comprises a plurality of fourth openings. The first electronic component is connected to the conductive layer via the fourth openings.

In the foregoing, the power module package further comprises an isolation layer covering part of the top surface of the conductive layer.

The present invention power module package uses the single-layered circuit board, which has the advantages of simple structure, simple manufacturing process, and low cost. In addition, by attaching components to two surfaces of the single-layered circuit board, the components are arranged to be as close as possible. The electrical loop formed among the components is the smallest. Therefore, the power module package of the present invention can have a higher power density and a reduced circuit inductance to reduce the circuit loss and optimize the electrical parameters of the power module (such as distributed inductance, flow capacity, impedance, etc.).

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
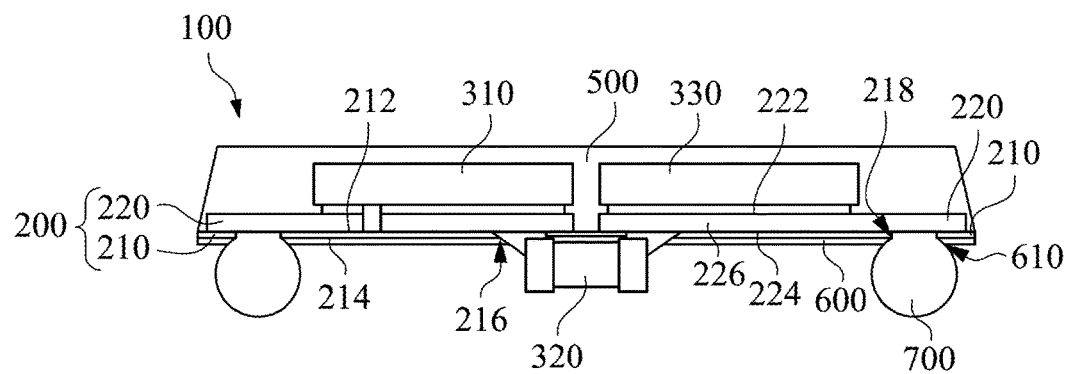
FIG. 1 is a cross-sectional schematic diagram of a power module package according to a first embodiment of this invention.

Reference will now be made in detail to the present embodiments of the invention, examples of which are illustrated in the accompanying drawings. Wherever possible, the same reference numbers are used in the drawings and the description to refer to the same or like parts.

A description is provided with reference to FIG. 1. FIG. 1 is a cross-sectional schematic diagram of a power module package according to a first embodiment of this invention. A power module package 100 comprises a single-layered circuit board 200 and a first electronic component 310 and a second electronic component 320 disposed on the single-layered circuit board 200. The single-layered circuit board 200 comprises an insulating substrate 210 and a conductive layer 220 thereon. The insulating substrate 210 has a top surface 212 and a bottom surface 214 opposite to each other. The conductive layer 220 also has a top surface 222 and a bottom surface 224 opposite to each other. The bottom surface 224 of the conductive layer 220 touches the top surface 212 of the insulating substrate 210.

The insulating substrate 210 has a plurality of first openings 216 to allow the bottom surface 224 of the conductive layer 220 disposed on the top surface 212 of the insulating substrate 210 to be exposed from the bottom surface 214 of the insulating substrate 210. In other words, the conductive layer 220 is disposed on the top surface 212 of the insulating substrate 210, and a portion of the conductive layer 220 covering the first openings 216 in the insulating substrate 210 is exposed from the insulating substrate 210.

The first electronic component 310 is disposed on the top surface 222 of the conductive layer 220. The second electronic component 320 is disposed on the bottom surface 214 of the insulating substrate 210 and received in the first openings 216 on the bottom surface 214 of the insulating substrate 210. The second electronic component 320 is connected to the bottom surface 224 of the conductive layer 220 via the first openings 216. At least one of the first electronic component 310 and the second electronic component 320 is a bare die, that is, a die has not been packaged yet, to decrease a thickness of the power module package 100. In practical applications, the first electronic component 310 located on the top surface 212 of the insulating substrate 210 is a bare die, or the second electronic component 320 located on the bottom surface 214 of the insulating substrate 210 is a bare die. Or, both the first electronic component 310 and the second electronic component 320 are bare dies so as to decrease an overall thickness of the power module package 100 under the package configuration that the first electronic component 310 and the second electronic component 320 are respectively disposed on two surfaces of the single-layered circuit board 200. Space caused by packaging the die(s) is thus saved to realize higher level of integration and increase usage efficiency in limited space.

Each of the above-mentioned dies may be, for example, a planar die, in which all bonding pads are located on a same surface of the die. The planar die is bonded to a circuit board in a flip-chip bonding manner. That is, all the bonding pads of the planar die face a same surface of the conductive layer 220 and are connected to bonding areas on the conductive layer 220 correspondingly.

According to the present embodiment, the power module package 100 may comprise a third electronic component 330 disposed on the top surface 222 of the conductive layer 220. At least one of the first electronic component 310 and the third electronic component 310 is a planar die. In the present embodiment, the first electronic component 310 and the third electronic component 330 are both planar dies, such as gallium nitride (GaN) dies, disposed on the top surface 222 of the conductive layer 220. The second electronic component 320 is a capacitor disposed on the bottom surface 214 of the insulating substrate 210 and received in the first openings 216. The second electronic component 320 is connected to the bottom surface 224 of the conductive layer 220 in the first openings 216. The second electronic component 320 is connected to the first electronic component 310 and the third electronic component 330 via the conductive layer 220.

The conductive layer 220 may be divided into a plurality of conductive blocks 226 isolated from one another depending on design requirements. The first electronic component 310, the second electronic component 320, and the third electronic component 330 are all disposed on one or more of the conductive blocks 226. The first electronic component 310 and the second electronic component 320 are at least connected together to the same conductive block 226 (such as the conductive block 226 on the left side of the figure) so as to realize an electrical connection between the first electronic component 310 and the second electronic component 320 via the conductive block 226. Correspondingly, the third electronic component 330 and the second electronic component 320 are also at least connected together to the same conductive block 226 (such as the conductive block 226 on the right side of the figure) so as to realize an electrical connection between the third electronic component 330 and the second electronic component 320.

The power module package 100 further comprises encapsulation plastic 500 for completely or partially wrapping the single-layered circuit board 200 and electronic components disposed on the single-layered circuit board 200, such as the first electronic component 310 and the third electronic component 330.

The power module package 100 further comprises a plurality of connecting structures 700. The insulating substrate 210 further comprises a plurality of second openings 218 corresponding to the connecting structures 700. The connecting structures 700 are disposed on the bottom surface 214 of the insulating substrate 210 and are connected to the conductive layer 220 in the second openings 218 so as to realize the connection between the electronic component(s) disposed on the conductive layer 220 and an external circuit via the connecting structures 700. In the present embodiment, the connecting structures 700 are solder balls. In other embodiments, the connecting structures 700 may be in a form of a pin or a wire.

The power module package 100 further comprises an isolation layer 600 covering the bottom surface 214 of the insulating substrate 210. The isolation layer 600 has a plurality of third openings 610. The first openings 216 and the third openings 610 corresponding to the first openings 216 communicate with each other vertically to allow the second electronic component 320 to connect to the conductive layer 220 in the first openings 216 and the corresponding third openings 610. The second openings 218 and the third openings 610 corresponding to the second openings 218 communicate with each other vertically. The connecting structures 700 are disposed on the bottom surface 214 of the insulating substrate 210 and are connected to the conductive layer 220 in the second openings 218 and the corresponding third openings 610. A material of the isolation layer 600 may be, for example, a solder mask.

Figure 2:
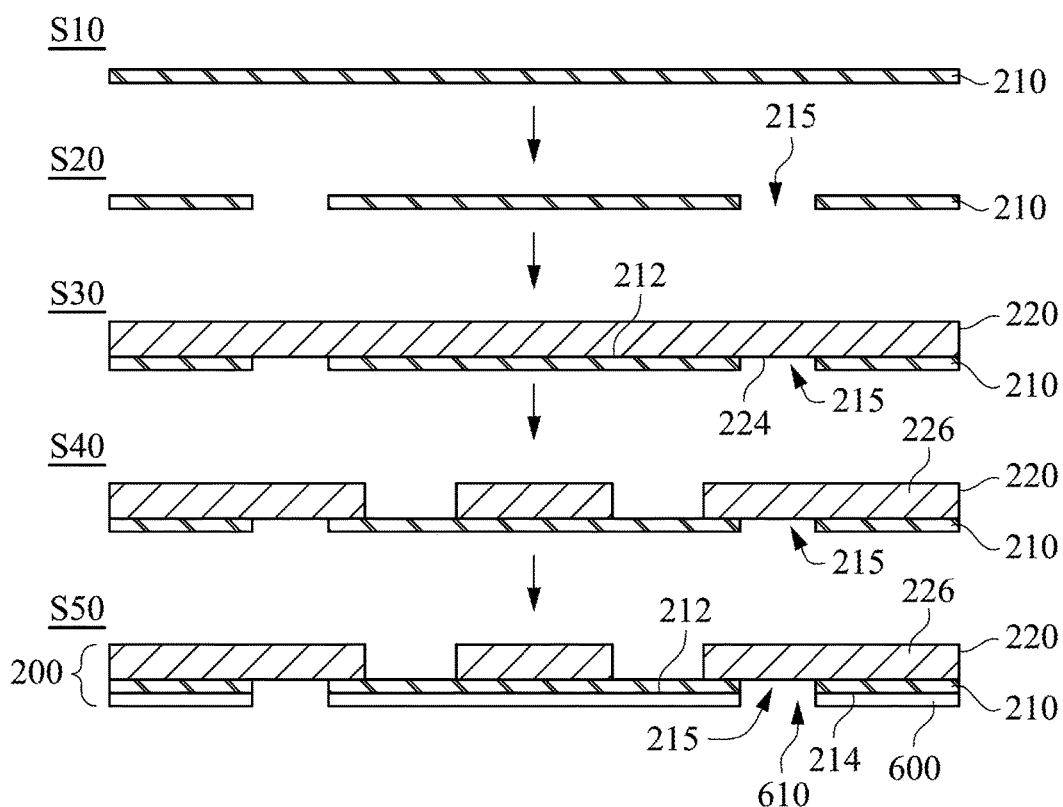
FIG. 2 to FIG. 4 are flow diagrams of manufacturing single-layered circuit boards of power module packages according to various embodiments of this invention.

A description is provided with reference to FIG. 2. FIG. 2 is a flow diagram of manufacturing a single-layered circuit board of a power module package according to one embodiment of this invention. All of the drawings provided in the figure are cross-sectional schematic diagrams. First, as shown in step S10, the insulating substrate 210 is provided. A material of the insulating substrate 210 may be a glass fiber (FR4), a BT resin, a polyimide (polyimide, PI) film, or ceramic.

Then, in step S20, the insulating substrate 210 is drilled to obtain a plurality of openings 215 penetrating through the insulating substrate 210. Drilling the insulating substrate 210 may be performed by mechanical drilling or laser drilling.

After that, in step S30, the conductive layer 220 is disposed on the insulating substrate 210. The conductive layer 220 is disposed on the top surface 212 of the insulating substrate 210, and the bottom surface 224 of the conductive layer 220 touches the top surface 212 of the insulating substrate 210. In some embodiments, a material of the conductive layer 220 is copper. The conductive layer 220 may be combined with the insulating substrate 210 through lamination.

Then, in step S40, the conductive layer 220 is etched to divide the conductive layer 220 into the plurality of conductive blocks 226 isolated from one another. Etching the conductive layer 220 may be performed by dry etching or wet etching.

After that, in step S50, the isolation layer 600 is coated on the bottom surface 214 of the insulating substrate 210. The material of the isolation layer 600 may be, for example, a solder mask. When disposing the isolation layer 600, positions of the openings 215 in the insulating substrate 210 must be avoided to allow the openings 215 and the conductive layer 220 covering the openings 215 to be completely or partially exposed from the isolation layer 600. In greater detail, the isolation layer 600 can completely or partially cover the openings 215. In other words, the plurality of third openings 610 are formed in the isolation layer 600, and the third openings 610 and the first openings 216 have a non-zero intersection to allow all or part of the conductive layer 220 to be exposed from the isolation layer 600.

Thus, the single-layered circuit board 200 comprising the single-layered insulating substrate 210 and the single-layered conductive layer 220 is obtained. The conductive layer 220 is divided into the plurality of conductive blocks 226 isolated from one another. In addition, the insulating substrate 210 has the openings 215 penetrating through the insulating substrate 210 to allow the conductive layer 220 to be exposed from the bottom surface 214 of the insulating substrate 210 via the openings 215.

In the present embodiment, as compared with a prior art multi-layered circuit board, the single-layered circuit board 200 uses large-area metal layers to replace through-holes, which is advantageous for through-flow and heat dissipation of a power device. In addition, resistances and stray inductances in a vertical direction and in a horizontal direction are lowered. The single-layered circuit board is mainly formed by laminating a single-layered insulating layer and a single-layered metal layer. The structure and manufacturing process are simple, the cost is low, and the reliability is high. As compared with a lead frame, the single-layered circuit board 200 has the single-layered insulating layer that serves as a support. The metal layer may be thick or thin. The design is more flexible and traces may be etched as required to realize a smaller line width and smaller line spacing.

Figure 3:
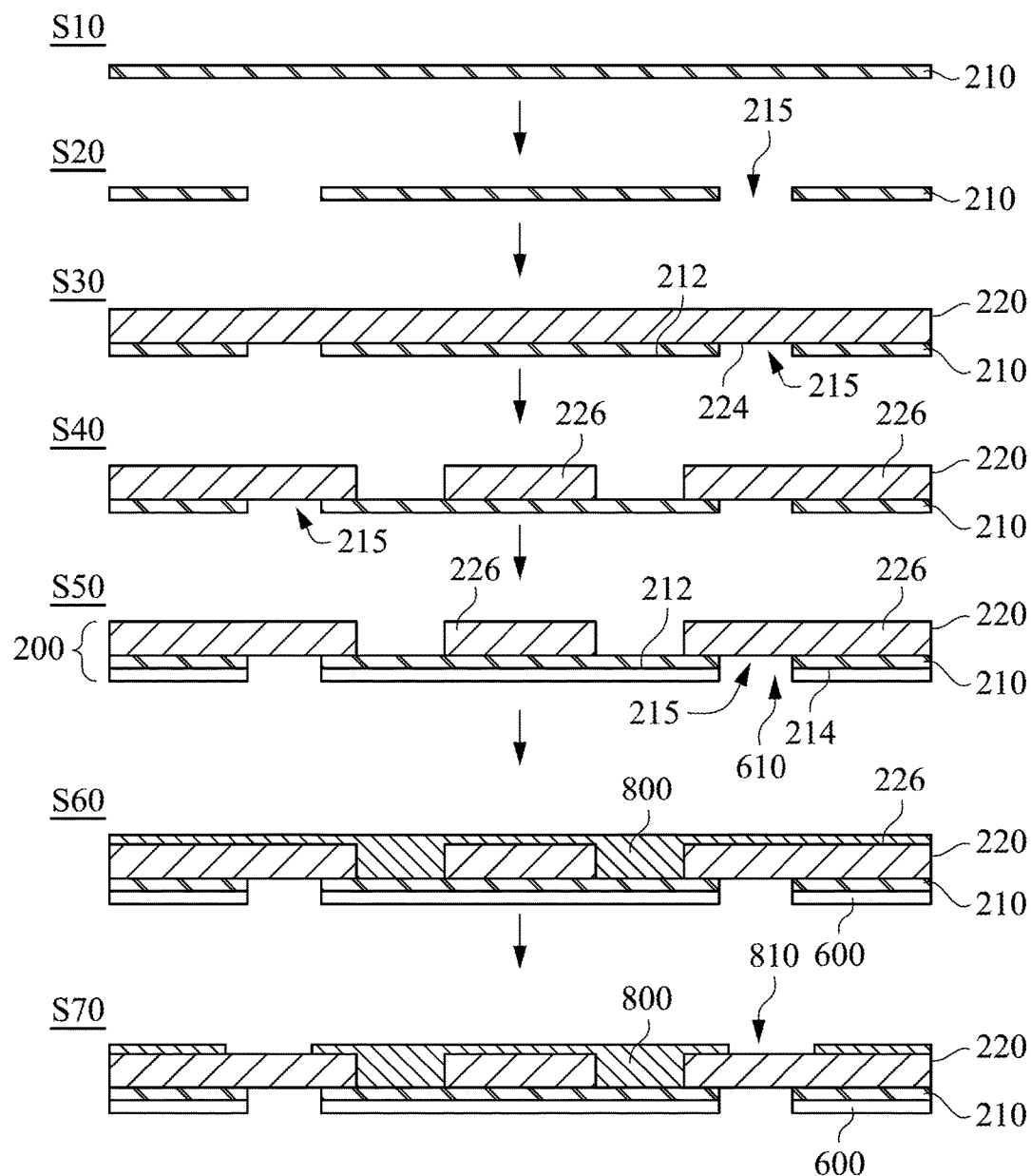
Figure 4:
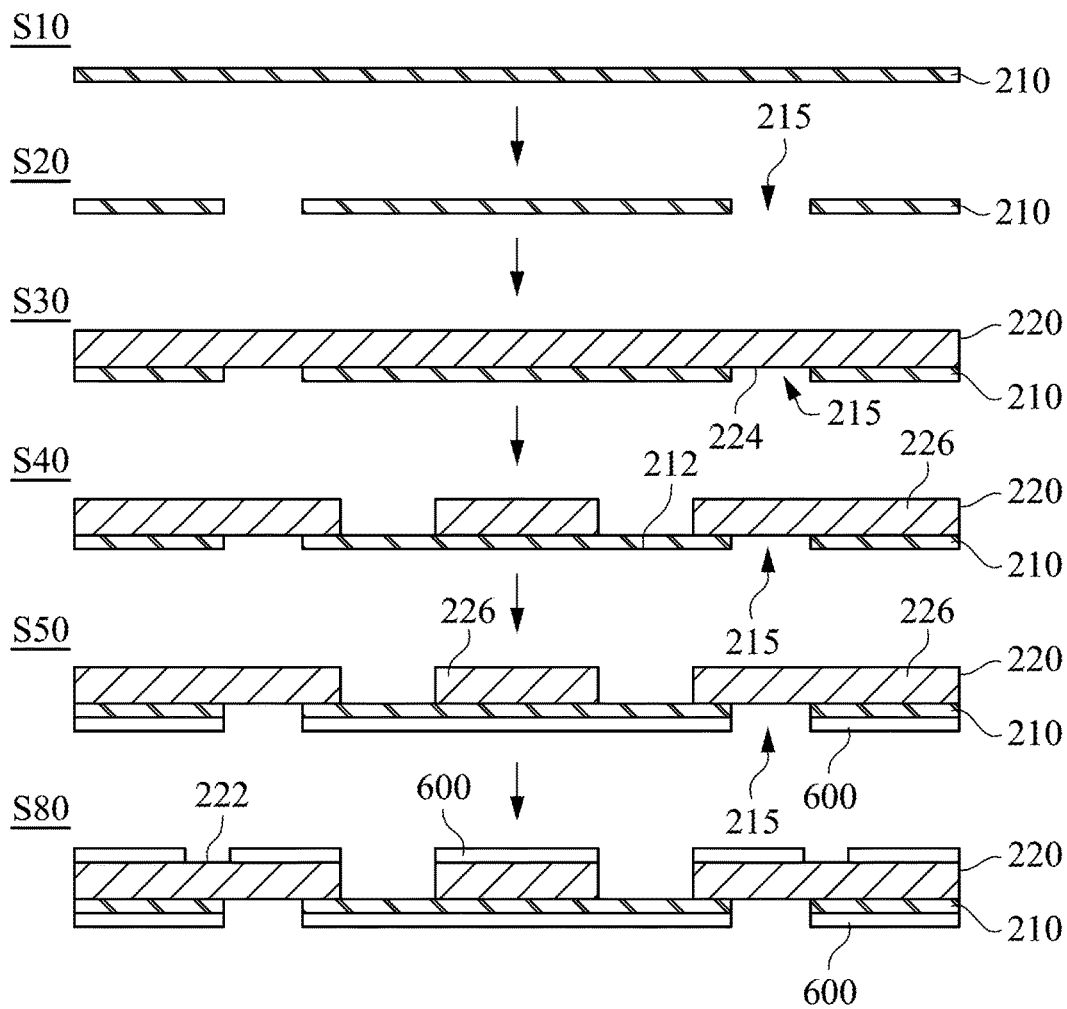

A description is provided with reference to FIG. 3 and FIG. 4. FIG. 3 and FIG. 4 are flow diagrams of manufacturing single-layered circuit boards of power module packages according to various embodiments of this invention. Similarly, all of the drawings provided in the figure are cross-sectional schematic diagrams. Since steps S10 to S50 in FIG. 3 and FIG. 4 are the same as those of the previous embodiment, a description in this regard is not provided.

In order to further enhance structural strength of the single-layered circuit board 200, step S60 and step S70 can be selectively added after S50 in FIG. 3. Step S60 comprises laminating an insulating layer 800 on the conductive layer 220. A material of the insulating layer 800 may be, for example, an ABF resin. Then, in step S70, fourth openings 810 are formed in the insulating layer 800 by etching or laser drilling to allow the first electronic component 310 and the third electronic component 330 in FIG. 1 to be connected to the conductive layer 220 in the fourth openings 810. By disposing the insulting layer 800 between the conductive layer 220 and the first electronic component 310 and the third electronic component 330, only areas of the conductive layer 220 serving as bonding pads are exposed. Areas not for bonding are thus protected to further avoid unexpected contacts between the first electronic component 310 and the third electronic component 330 and the conductive layer 220.

Or, as shown in FIG. 4, step S80 is selectively performed after S50. In step S80, the isolation layer 600 made of a solder mask material is also coated on the top surface 222 of the conductive layer 220. Similarly, the isolation layer 600 also has openings correspondingly to expose the areas of the conductive layer 220 serving as the bonding pads so as to allow the first electronic component 310 and the third electronic component 330 in FIG. 1 to be connected to the conductive layer 220 via the openings. At the same time, the unexpected contacts between the first electronic component 310 and the third electronic component 330 and the conductive layer 220 are avoided.

Figure 5:
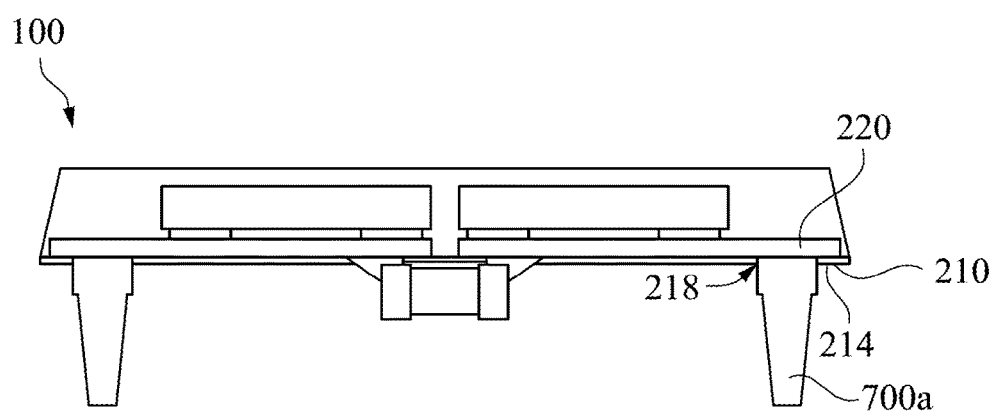
FIG. 5 and FIG. 6 are cross-sectional schematic diagrams of power module packages according to various embodiments of this invention.
Figure 6:
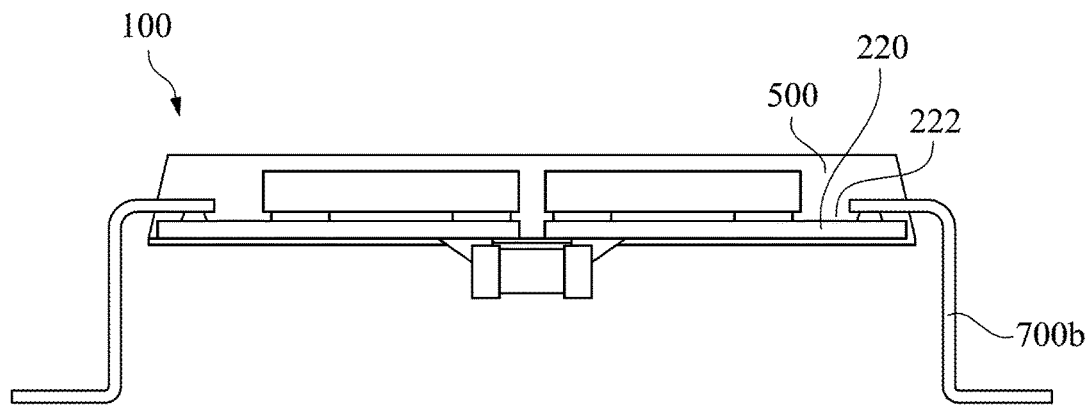

A description is provided with reference to FIG. 5 and FIG. 6. FIG. 5 and FIG. 6 are cross-sectional schematic diagrams of power module packages 100 according to various embodiments of this invention. The difference between the embodiment shown in FIG. 5 and the embodiment shown in FIG. 1 is that connecting structures 700a of the power module package 100 in FIG. 5 may be direct plug-in pins. The connecting structures 700a are disposed on the bottom surface 214 of the insulating substrate 210, and are connected to the conductive layer 220 in the second openings 218. The difference between the embodiment shown in FIG. 6 and the embodiment shown in FIG. 1 is that connecting structures 700b in FIG. 6 are surface mount pins, and one end of each of the connecting structures 700b is directly soldered on the top surface 222 of the conductive layer 220 and packaged by the encapsulating plastic 500.

Figure 7A:
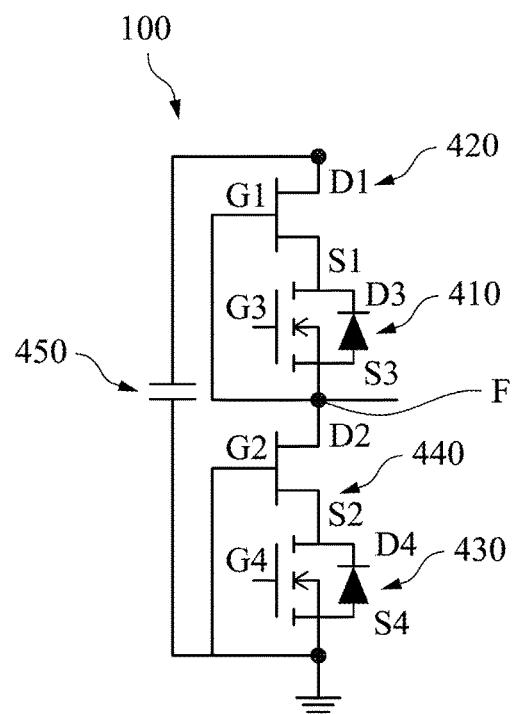
FIG. 7A to FIG. 7D are a circuit diagram, a top schematic diagram, a bottom schematic diagram, and a cross-sectional schematic diagram of a power module package according to another embodiment of this invention.

A description is provided with reference to FIG. 7A to FIG. 7D. FIG. 7A to FIG. 7D are a circuit diagram, a top schematic diagram, a bottom schematic diagram, and a cross-sectional schematic diagram of the power module package 100 according to another embodiment of this invention. As shown in FIG. 7A, the power module package 100 comprises a first electronic component, a second electronic component, a third electronic component, a fourth electronic component, and a fifth electronic component. According to the present embodiment, the first electronic component, the third electronic component, and the fifth electronic component are respectively a low voltage metal-oxide-semiconductor transistor (MOS transistor) 410, a low voltage MOS transistor 430, and a capacitor 450. The second electronic component and the fourth electronic component are respectively a gallium nitride die 420 and a gallium nitride die 440. At least one of the capacitor 450 and the gallium nitride 420 is a bare die.

The gallium nitride dies 420, 440 are normally-on components. In detail, a source electrode and a drain electrode of the component are kept in a conducting state when no gate voltage is applied. Driving a normally-on component is more difficult than driving a normally-off component. Hence, in applications, the gallium nitride dies 420, 440 are respectively connected in series with the low voltage MOS transistors 410, 430 so as to form cascade circuits. A driving method similar to that for a normally-off component is thus adopted. As shown in FIG. 7A, the gallium nitride die 420 and the low voltage MOS transistor 410 form the cascade circuit. In greater detail, a source electrode S1 and a gate electrode G1 of the gallium nitride die 420 are respectively connected to a drain electrode D3 and a source electrode S3 of the low voltage MOS transistor 410. Similarly, the gallium nitride die 440 and the low voltage MOS transistor 430 form the cascade circuit. In greater detail, a source electrode S2 and a gate electrode G2 of the gallium nitride die 440 are respectively connected to a drain electrode D4 and a source electrode S4 of the low voltage MOS transistor 430. As shown in FIG. 7A, a drain electrode D1 of the gallium nitride die 420 is connected to Vbus and one terminal of the capacitor 450. The source electrode S3 of the low voltage MOS transistor 410 is connected to a drain electrode D2 of the gallium nitride die 440. The source electrode S4 of the low voltage MOS transistor is connected to the other terminal of the capacitor 450 and is connected to the ground GND.

In order to improve the safety of gate driving, it is usually required that parasitic inductances between the low voltage MOS transistors 410, 430 and the gallium nitride dies 420, 440 in the power module package 100 are as small as possible. Therefore, it is desirable that distances between them are as small as possible. The smallest distance between dies occurs when the structure is stacked in a vertical manner. However it is very difficult to stack another die onto a source pad that has a smaller area in a prior art package.

The present invention power module package 100 interconnects electronic components through two surfaces of the single-layered circuit board 200 to realize the vertical stack of the gallium nitride dies 420, 440 and the low voltage MOS transistors 410, 430 so as to minimize the distances between them.

Figure 7B:
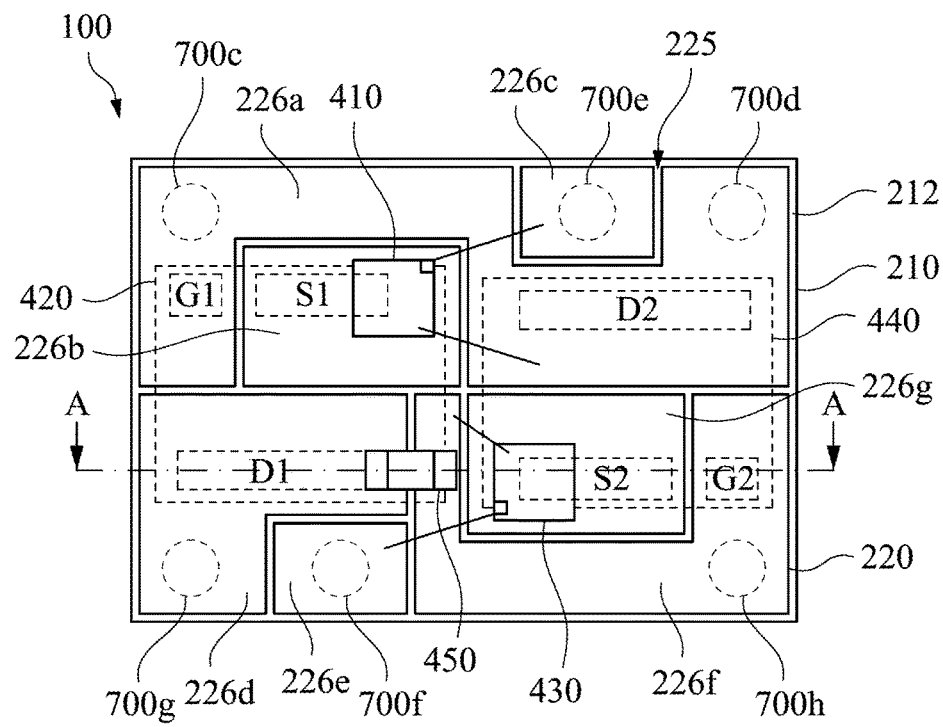
Figure 7C:
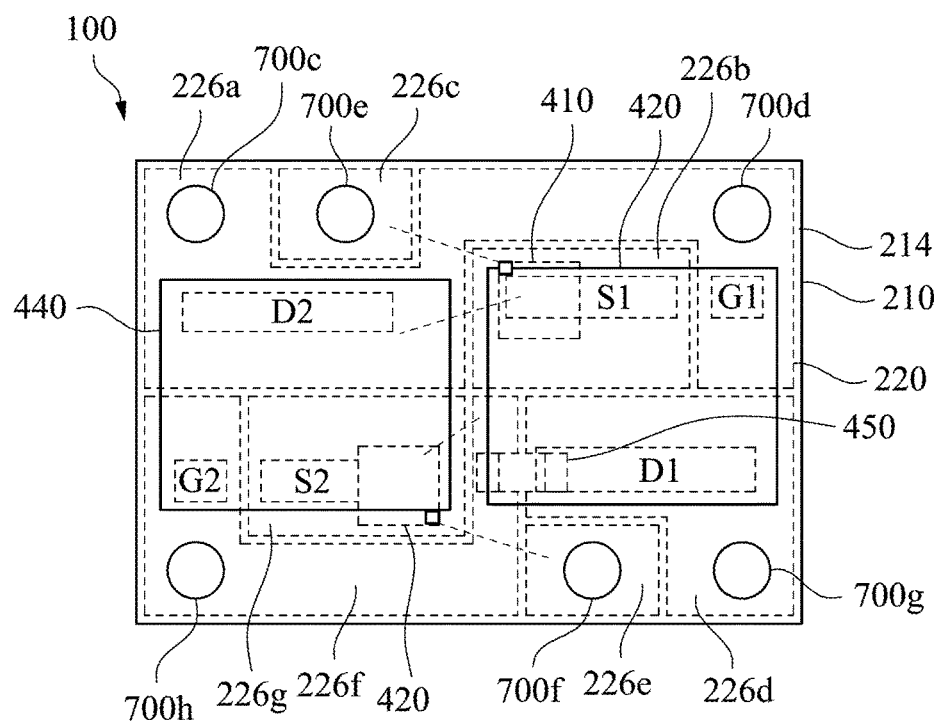

Then, as shown in FIG. 7B and FIG. 7C, the low voltage MOS transistors 410, 430 and the capacitor 450 are disposed on the top surface 222 of the conductive layer 220. The gallium nitride dies 420, 440 are disposed on the bottom surface 214 of the insulating substrate 210 and are electrically connected to the conductive layer 220 via openings in the insulating substrate 210 (such as the above-mentioned first openings 216). The conductive layer 220 is divided into a plurality of conductive blocks 226a-226g isolated from one another by the divisional passages 225. Two connecting structures 700c, 700d are disposed on the conductive block 226a to realize connections to an external circuit. The two connecting structures 700c, 700d are also corresponding to a connecting point (F) in FIG. 7A. A connecting structure 700e is disposed on the conductive block 226c to connect to an external driving circuit corresponding to the low voltage MOS transistor 410 and connect to the gate electrode G3 of the low voltage MOS transistor 410 in FIG. 7A correspondingly via the conductive block 226c. A connecting structure 700f is disposed on the conductive block 226e to connect to an external driving circuit corresponding to the low voltage MOS transistor 430 and connect to the gate electrode G4 of the low voltage MOS transistor 430 in FIG. 7A correspondingly via the conductive block 226e. A connecting structure 700g is disposed on the conductive block 226d to connect to Vbus in FIG. 7A correspondingly. A connecting structure 700h is disposed on the conductive block 226f to serve as the ground terminal GND in FIG. 7A correspondingly. In the present embodiment, the connecting structures 700c-700h being solder balls are examples for illustrative purposes only, but the present invention is not limited in this regard. In other embodiments, the connecting structures 700c-700h may also be direct insert process (DIP) pins or surface mount technique (SMT) pins. The low voltage MOS transistors 410, 430 are respectively disposed right above the source electrodes of the gallium nitride dies 420, 440, that is, on the conductive blocks 226b, 226g. The capacitor 450 is disposed on the conductive block 226d and the conductive block 226f. The low voltage MOS transistors 410, 430 and the capacitor 450 are connected to the gallium nitride dies 420, 440 via the conductive layer 220.

In greater detail, the drain electrode D1 of the gallium nitride die 420 is disposed on the conductive block 226d and connected to the connecting structure 700g via the conductive layer 220. The source electrode S1 is disposed on the conductive block 226b. The gate electrode G1 is disposed on the conductive block 226a and connected to the connecting structure 700c via the conductive layer 220. The drain electrode D3 of the low voltage MOS transistors 410 is disposed on the conductive block 226b and connected to the source electrode S1 of the gallium nitride die 420 via the conductive layer 220. The gate electrode G3 is connected to the conductive block 226c via a wire and is connected to the connecting structure 700e on the conductive block 226c via the conductive layer 220 so as to connect to an external driving circuit. The source electrode S3 is connected to the conductive block 226a via a wire and connected to the connecting structure 700d via the conductive layer 220. The gallium nitride die 420 and the drain electrode D2 of the gallium nitride die 440 are also disposed on the conductive block 226a and connected to the conducting structure 700d via the conductive structure 220. The gate electrode G2 is disposed on the conductive block 226f and connected to the connecting structure 700h via the conductive layer 220. The source electrode S2 is disposed on the conductive block 226g. The drain electrode D3 of the low voltage MOS transistor 430 is disposed on the conductive block 226g and connected to the source electrode S2 of the gallium nitride die 440 via the conductive layer 220. The gate electrode G4 is connected to the conductive block 226e via a wire and connected to the connecting structure 700f via the conductive layer 220 so as to connect to an external driving circuit. The source electrode S4 is connected to the conductive block 226f via a wire and connected to the connecting structure 700h via the conductive layer 220. The two terminals of the capacitor 450 are respectively disposed on the conductive block 226d and the conductive block 226f and respectively connected to the connecting structure 700g and the connecting structure 700h via the conductive layer 220. In other words, it is realized that the two terminals of the capacitor 450 are respectively connected to Vbus and the ground terminal GND. It is noted that the electrode(s) or terminal of the electronic component(s) and the connecting structure(s) located on the same conductive block are electrically connected to one another via the conductive layer 220. In greater detail, orthogonal projections of the low voltage MOS transistors 410, 430 onto the insulating substrate 210 overlap orthogonal projections of the gallium nitride dies 420, 440 corresponding to the low voltage MOS transistors 410, 430 onto the insulating substrate 210 so as to shorten current paths and save space in the configuration through stacking vertically.

Figure 7D:
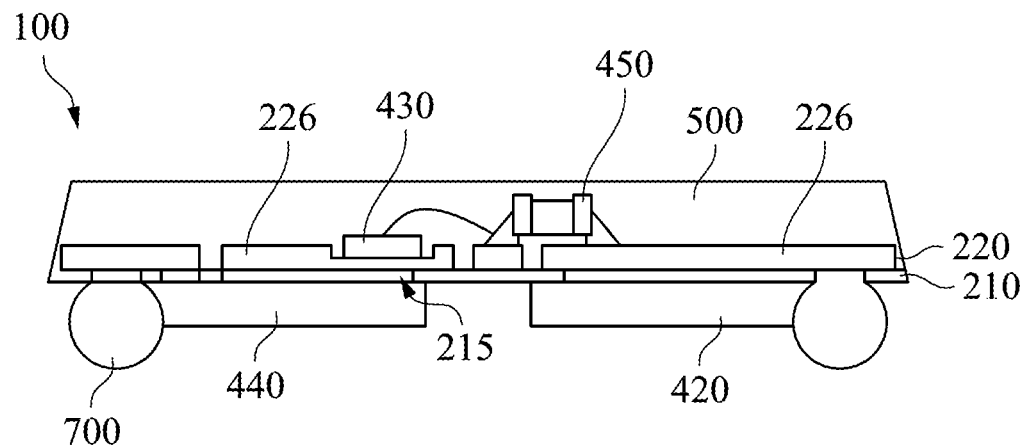

After that, a description is provided with reference to FIG. 7D. FIG. 7D is a cross-sectional view taken along line A-A in FIG. 7B. As can be seen clearly in the figure, the low voltage MOS transistors 410, 430 and the capacitor 450 are connected to the conductive layer 220. The low voltage MOS transistors 410, 430 and the capacitor 450 can be affixed to the conductive layer 220 through, for example, bonding and electrically connected to the conductive layer 220. The gallium nitride dies 420, 440 are connected to the conductive layer 220 via the openings 215 in the insulating substrate 210, and similarly, can be affixed to the conductive layer 220 by using soldering. The encapsulating plastic 500 wraps the top surface of the insulating substrate 210 to finish packaging. The connecting structures 700 are disposed on the conductive blocks 226 correspondingly and exposed from the encapsulating plastic 500 so as to connect the power module package 100 and an external circuit.

In addition to that, the conductive block 226 may have at least one concave portion to allow at least one of the electronic components in the present embodiment, such as the low voltage MOS transistor 430, to be placed in the concave portion of the conductive block 226 according to the present embodiment. As a result, connecting distances between the electronic components (such as the low voltage MOS transistor and the gallium nitride die corresponding to it) are further shortened to reduce a height of the power module package 100. In the present embodiment, positions on the conductive layer 220 where the low voltage MOS transistors are placed are semi-etched to decrease a thickness of the conductive layer 220. In this manner, positions where vertical conduction and through-flow are necessary (such as the source electrode S1 of the gallium nitride die 420 and the drain electrode D3 of the low voltage MOS transistor 410) are semi-etched to decrease the thickness of the conductive layer 220, and positions where horizontal conduction and through-flow are necessary still retain a thicker conductive layer 220 so as to optimize the electrical performance.

As can be understood from the present embodiment, the gallium nitride dies 420, 440 and the low voltage MOS transistors 410, 430 can be stacked in a vertical manner. Hence, a space utilization ratio and a power density of the power module package 100 are improved, and inductance(s) and resistance(s) in the circuit are reduced to reduce a circuit loss. In addition, driving circuits for the low voltage MOS transistor 410, 430 may also be integrated into the power module package to further increase the integration and power density of the power module.

It is noted that the electronic components in the present embodiment are for illustrative purposes only and are not intended to limit the present invention. Those of ordinary skill in the art may select suitable types of electronic components depending on practical design requirements.

Figure 8A:
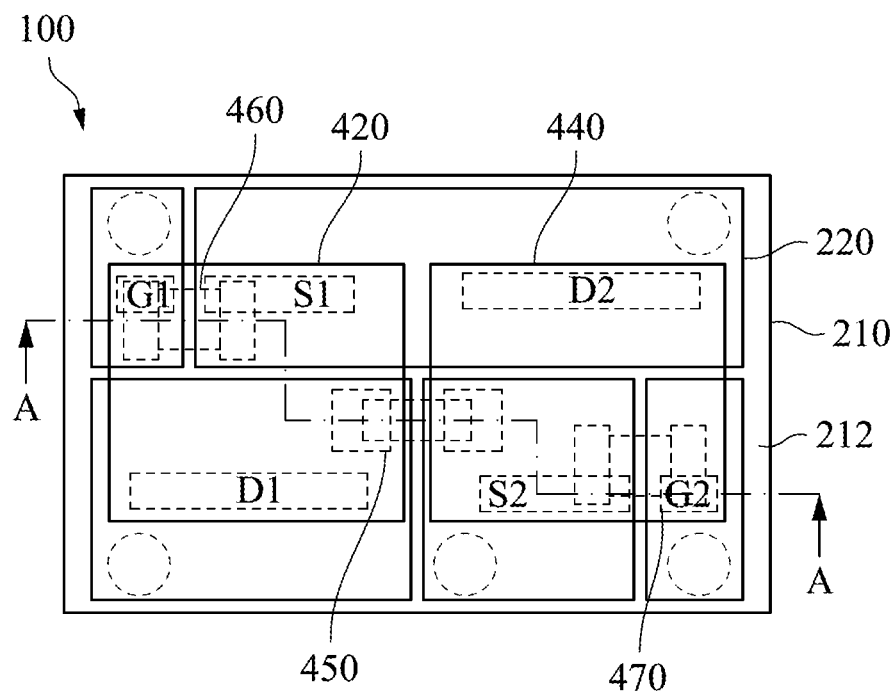
FIG. 8A to FIG. 8C are a top schematic diagram, a bottom schematic diagram, and a cross-sectional schematic diagram of a power module package according to still another embodiment of this invention.
Figure 8B:
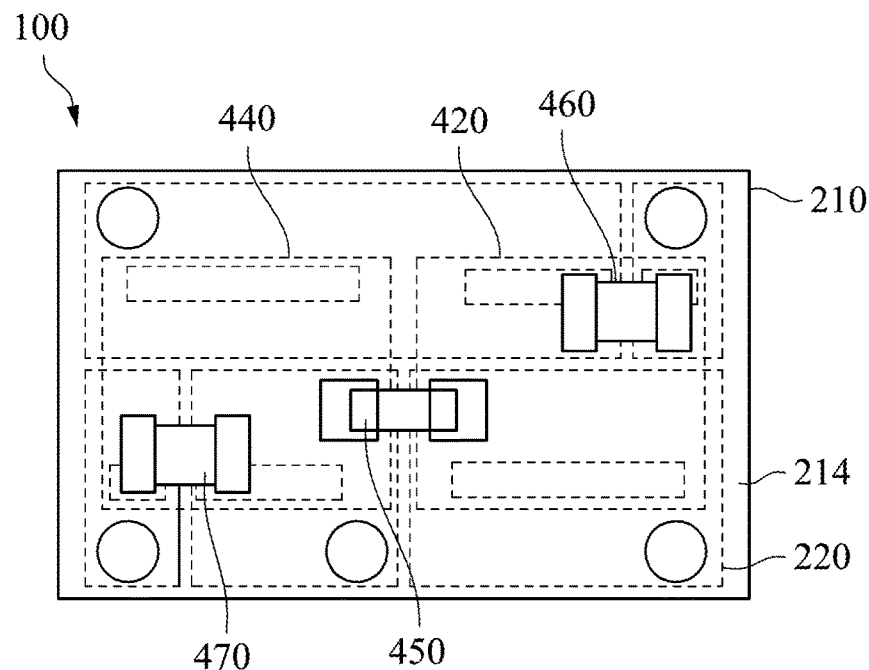
Figure 8C:
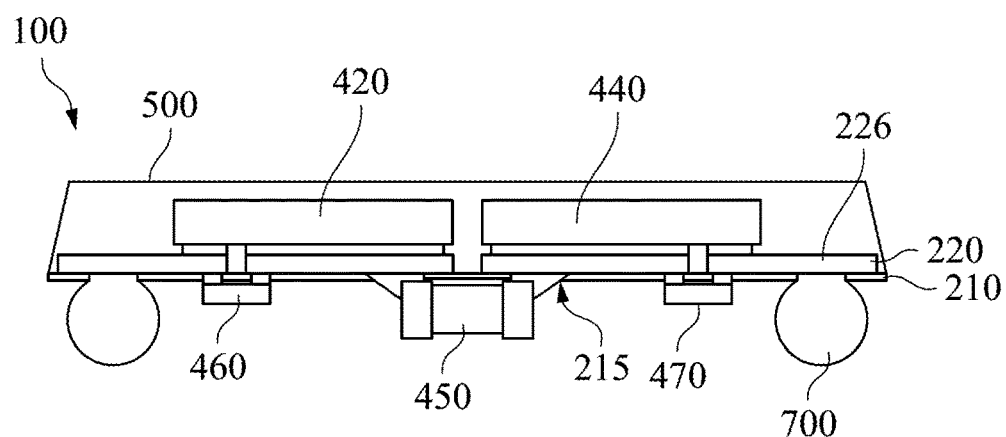

A description is provided with reference to FIG. 8A to FIG. 8C. FIG. 8A to FIG. 8C are a top schematic diagram, a bottom schematic diagram, and a cross-sectional schematic diagram of the power module package 100 according to still another embodiment of this invention. The power module package 100 comprises the insulating substrate 210, the conductive layer 220 disposed on the top surface 212 of the insulating substrate 210, the first electronic component, the second electronic component, the third electronic component, the fourth electronic component, and the fifth electronic component. The first electronic component and the third electronic component are disposed on the top surface 222 of the conductive layer 220 and are affixed to the conductive layer 220. The second electronic component, the fourth electronic component, and the fifth electronic component are disposed on the bottom surface 214 of the insulating substrate 210 and are connected to the conductive layer 220 via the openings 215 in the insulating substrate 210. At least one of the first electronic component and the second electronic component is a bare die. At least one of the first electronic component and the third electronic component is a planar die. In addition, the bare die may be a planar die.

According to the present embodiment, both the first electronic component and the third electronic component are planar dies, such as gallium nitride dies. The second electronic component, the fourth electronic component, and the fifth electronic component are respectively the capacitor 450, a driving component 460, and a driving component 470. The encapsulating plastic 500 wraps the top surface 212 of the insulating substrate 210 to finish packaging. The connecting structures 700 are connected to the conductive blocks 226 correspondingly and exposed from the encapsulating plastic 500 so as to connect the power module package 100 and an external circuit.

The driving components 460, 470 are respectively used for driving the first electronic component and the third electronic component, and the driving components 460, 470 and the first electronic component and the third electronic component are respectively stacked in a vertical manner. That is, the orthogonal projections of the driving components 460, 470 onto the insulating substrate 210 respectively overlap the orthogonal projections of the first electronic component and the third electronic component onto the insulating substrate 210.

Two terminals of the driving component 460 are respectively disposed right below the gate electrode G1 and the source electrode S1 of the gallium nitride die 420, and are respectively connected to the gate electrode G1 and the source electrode S1 of the gallium nitride die 420 via the conductive layer 220. Similarly, two terminals of the driving component 470 are respectively disposed right below the gate electrode G2 and the source electrode S2 of the gallium nitride die 440, and are respectively connected to the gate electrode G2 and the source electrode S2 of the gallium nitride die 440 via the conductive layer 220. In other words, the orthogonal projections of the driving components 460, 470 onto the insulating substrate 210 respectively overlap the orthogonal projections of the source electrodes S1, S2 and the gate electrodes G1, G2 of the gallium nitride dies 420, 440 corresponding to the driving components 460, 470 onto the insulating substrate 210. By respectively stacking the gallium nitride dies 420, 440 and the driving components 460, 470 in a vertical manner, the power module package 100 is allowed to have a higher space utilization ratio and a higher power density, and a distance between each of the power components and the driving component corresponding to the each of the power components is shortened to reduce inductance(s) in the circuit so as to reduce a circuit loss. Since the disposition method of the gallium nitride dies 420, 440 is the same as that in FIG. 7A to FIG. 7D, a description in this regard is not provided.

In other embodiments, the power module package 100 can integrate more electronic components to provide a higher space utilization ratio and a higher power density, and a description in this regard is not provided.

Since the power module package 100 itself is a heating element, it usually needs to cooperate with an additional heat dissipation component to carry away heat generated by the power module package 100 in high power applications so as to avoid damage of the components in the power module package 100 due to overheating. Hence, the power module package 100 of the present invention may further integrate the heat dissipation component in the power module package 100 to shorten a heat dissipation path. A description with reference to embodiments is provided as follows.

Figure 9A:
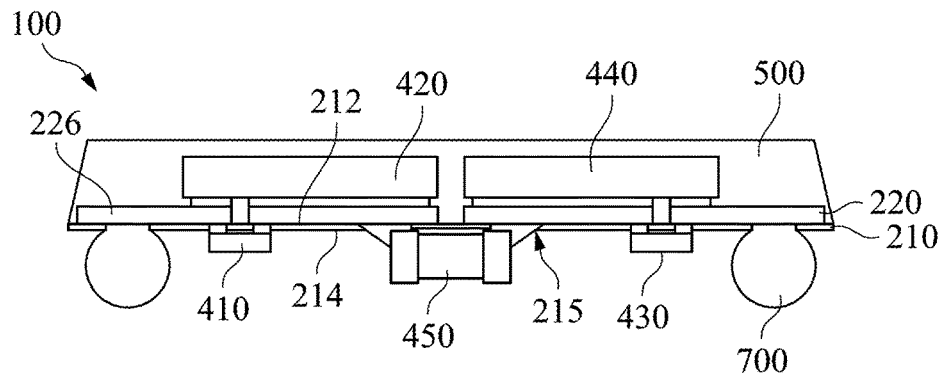
FIG. 9A to FIG. 9D are flow diagrams of manufacturing a power module package respectively at different stages according to still another embodiment of this invention.

A description is provided with reference to FIG. 9A to FIG. 9D. FIG. 9A to FIG. 9D are flow diagrams of manufacturing a power module package respectively at different stages according to still another embodiment of this invention. As shown in FIG. 9A, the power module package 100 is provided. The power module package 100 comprises the insulating substrate 210, the conductive layer 220 disposed on the top surface 212 of the insulating substrate 210, electronic components disposed on the top surface of the conductive layer 220, such as the gallium nitride dies 420, 440, and electronic components disposed on the bottom surface of the insulating substrate 210, such as the low voltage MOS transistors 410, 430, the capacitor 450, or some other electronic component not depicted, such as a driving component. The gallium nitride dies 420, 440 are affixed to the conductive layer 220. The low voltage MOS transistors 410, 430 and the capacitor 450 are connected to the conductive layer 220 in the openings 215 in the insulating substrate 210. The encapsulating plastic 500 wraps the top surface 212 of the insulating substrate 210 to finish packaging. The connecting structures 700 are connected to the conductive layer 220 and exposed from the encapsulating plastic 500 so as to connect the power module package 100 and an external circuit. It is noted that a configuration of the power module package 100 in the present invention is not limited to the configuration described in the present embodiment, and those of ordinary skill in the art may perform adjustment depending on various requirements.

Figure 9B:
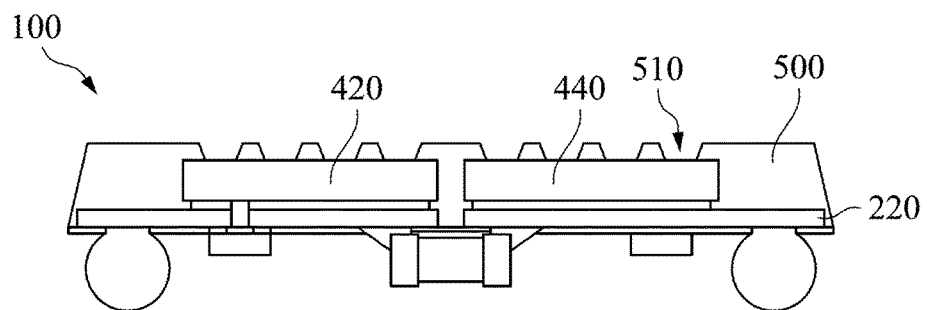

Then, as shown in FIG. 9B, laser drilling is utilized to drill a top surface (the same side as the conductive layer 220) of the power module package 100 so as to remove the encapsulating plastic 500 above the gallium nitride dies 420, 440 and allow a portion of the gallium nitride dies 420, 440 to be exposed from openings 510 in the encapsulating plastic 500.

Figure 9C:
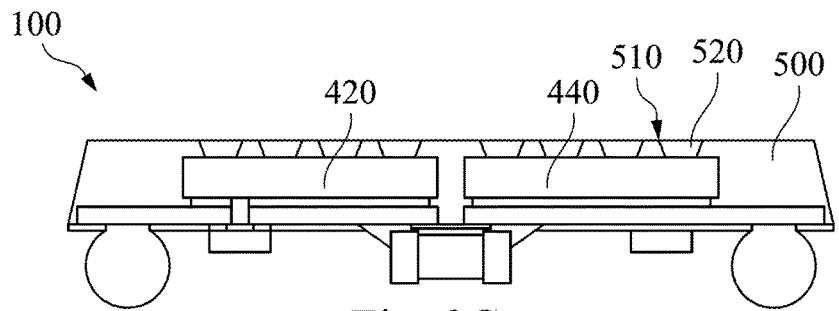

After that, as shown in FIG. 9C, metal pieces 520 having high heat conductivity, such as copper, are filled into the openings 510. The metal pieces 520 may be filled into the openings 510 in the encapsulating plastic 500 by electroplating or printing and contact wirh the gallium nitride dies 420, 440. Surfaces of the metal pieces 520 are basically aligned with a surface of the encapsulating plastic 500.

Figure 9D:
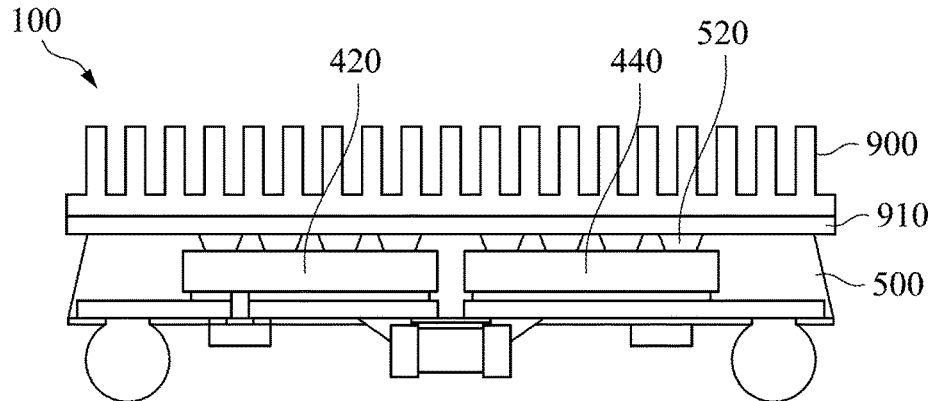

Finally, as shown in FIG. 9D, a heat dissipation component 900, such as a set of heat dissipation fins, is attached to a top surface of the power module package 100 by utilizing thermally conductive adhesive 910 that is insulative or a thermally conductive insulation film, and the heat dissipation component 900 contacts the encapsulating plastic 500 and the metal pieces 520. Not only dose the thermally conductive adhesive 910 provide a function of heat conduction, but also the thermally conductive adhesive 910 electrically isolates the electronic components (such as the gallium nitride dies 420, 440) mounted on a surface of the conductive layer 220 and the heat dissipation component 900.

Therefore, the heat generated by the power module package 100, especially by the gallium nitride dies 420, 440 in it, can be transferred to the heat dissipation component 900 via the metal pieces 520 and the thermally conductive adhesive 910, and dissipated by the heat dissipation component 900.

Figure 10A:
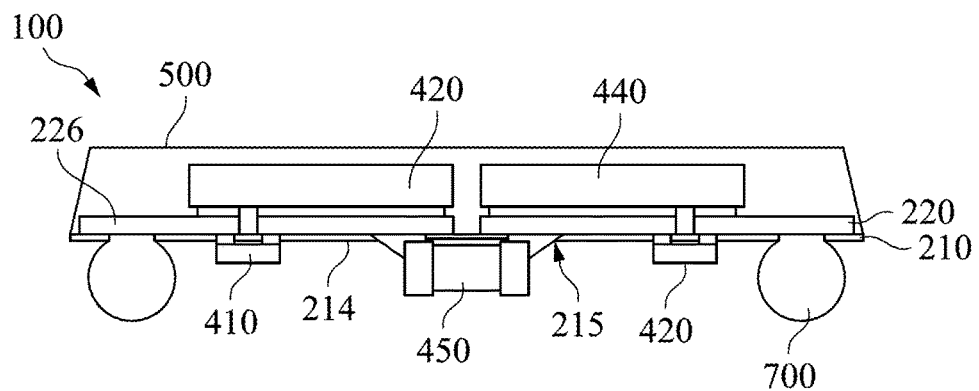
FIG. 10A to FIG. 10C are flow diagrams of manufacturing a power module package respectively at different stages according to yet another embodiment of this invention.
Figure 10B:
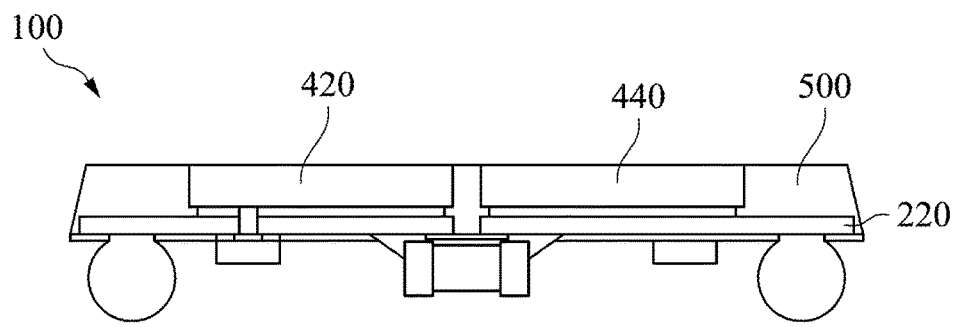
Figure 10C:
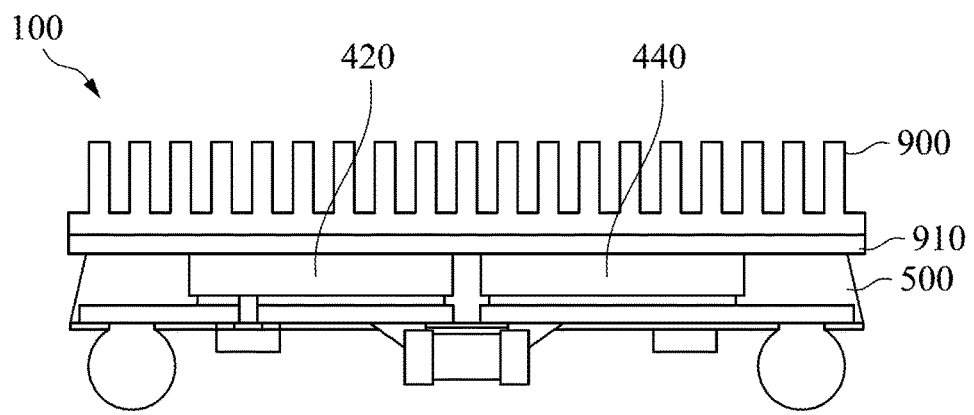

A description is provided with reference to FIG. 10A to FIG. 10C. FIG. 10A to FIG. 10C are flow diagrams of manufacturing a power module package respectively at different stages according to yet another embodiment of this invention. The main difference between the present embodiment and the embodiment shown in FIG. 9A to FIG. 9D is the step shown in FIG. 10B. As shown in FIG. 10B, the encapsulating plastic 500 on the top surface of the power module package 100 (the same side as the conductive layer 220) is removed to expose the electronic components. The step of removing the encapsulating plastic 500 can be finished by a method, such as grinding. Then, as shown in FIG. 10C, the heat dissipation component 900 is affixed to the electronic components and the remaining encapsulating plastic 500 by utilizing the thermally conductive adhesive 910 that is insulative or the thermally conductive insulation film. Not only dose the thermally conductive adhesive 910 provide the function of heat conduction, but also the thermally conductive adhesive 910 electrically isolates the electronic components and the heat dissipation component 900. The heat generated by the power module package 100, especially by the electronic components in it, can be transferred to the heat dissipation component 900 via the thermally conductive adhesive 910, and dissipated by the heat dissipation component 900. By adopting the above method, the power module package 100 is thinned, so that heat dissipation paths between the electronic components and the heat sink become shorter and the thermal resistances are lowered.

Figure 11A:
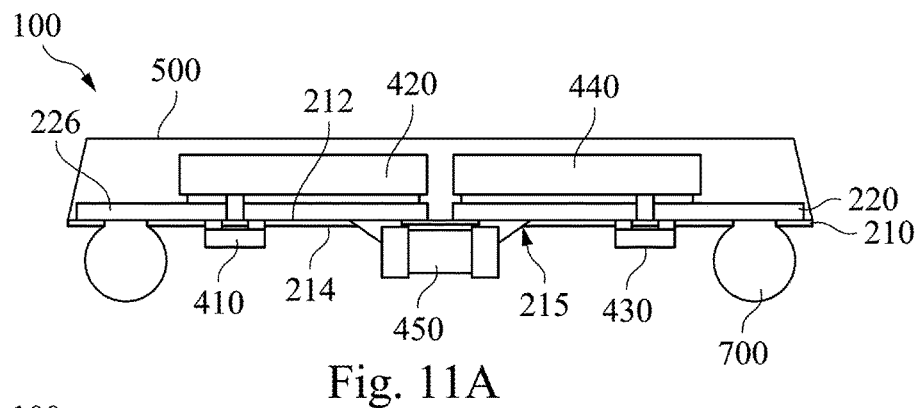
FIG. 11A to FIG. 11D are flow diagrams of manufacturing a power module package respectively at different stages according to another embodiment of this invention.

A description is provided with reference to FIG. 11A to FIG. 11D. FIG. 11A to FIG. 11D are flow diagrams of manufacturing a power module package respectively at different stages according to another embodiment of this invention. First, as shown in FIG. 11A, the power module package 100 is provided. Since a configuration method of the power module package 100 is the same as that of the above embodiment, a description in this regard is not provided.

Figure 11B:
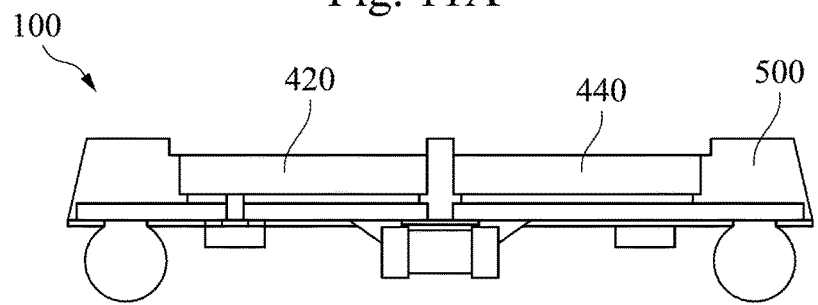
Figure 11C:
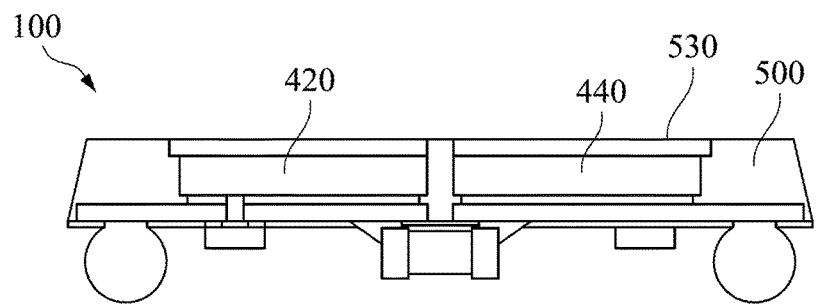
Figure 11D:
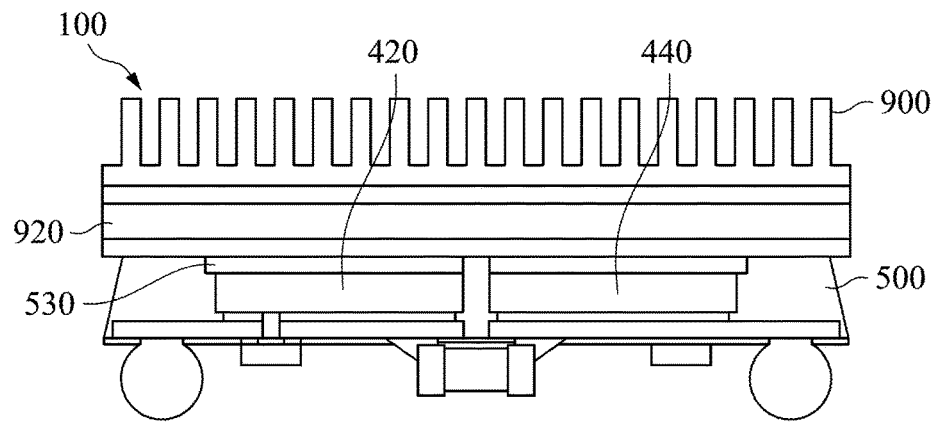

Then, as shown in FIG. 11B, the encapsulating plastic 500 above the electronic components in the power module package 100 is removed. That is, part of the encapsulating plastic 500 on the top surface of the power module package 100 is removed to expose the electronic components. The step of removing part of the encapsulating plastic 500 can be achieved by a method, such as laser etching, sand blasting, corroding. After that, as shown in FIG. 11C, a heat conducting layer 530 (such as solder paste, conductive silver paste, copper plating) is electroplated or printed at positions where the encapsulating plastic 500 is removed. Finally, as shown in FIG. 11D, a ceramic substrate 920 is first bonded to the heat conducting layer 530, then the heat dissipation component 900 is bonded to the ceramic substrate 920. Hence, the power module package 100 integrated with the heat dissipation component 900 is obtained to improve the heat dissipation ability of the power module package 100.

In summary, the power module package of the present invention uses the single-layered circuit board, which has the advantages of simple structure, simple manufacturing process, and low cost. In addition, by attaching components to two surfaces of the single-layered circuit board, the vertical stacked configuration is utilized to arrange the electronic components as close as possible. The electrical loop formed among the components is the smallest. Therefore, the power module package of the present invention has a higher power density and a reduced circuit inductance to reduce the circuit loss and optimize the electrical parameters of the power module (such as distributed inductance, flow capacity, impedance, etc.).

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A power module package comprising:
   a single-layered circuit board comprising an insulating substrate and a conductive layer disposed on the insulating substrate, the insulating substrate having a top surface and a bottom surface opposite to each other, the conductive layer having a top surface and a bottom surface opposite to each other, wherein the bottom surface of the conductive layer touches the top surface of the insulating substrate, and the insulating substrate has a plurality of first openings to allow the bottom surface of the conductive layer to be exposed from the bottom surface of the insulating substrate;
   a first electronic component disposed on the top surface of the conductive layer; and
   a second electronic component disposed on the bottom surface of the insulating substrate and embedded in the first openings, wherein the second electronic component is connected to the conductive layer via the first openings, and at least one of the first electronic component and the second electronic component is a bare die.

2. The power module package of claim 1, wherein the bare die is a planar die, and the planar die is bonded to the conductive layer in a flip-chip bonding manner.

3. The power module package of claim 2, further comprising a third electronic component, wherein the second electronic component is a capacitor, at least one of the first electronic component and the third electronic component is a planar die, and the third electronic component is disposed on the top surface of the conductive layer.

4. The power module package of claim 3, further comprising two driving components respectively used for driving the first electronic component and the third electronic component, both the driving components being disposed in the first openings on the bottom surface of the insulating substrate, wherein orthogonal projections of the driving components onto the insulating substrate respectively overlap orthogonal projections of the first electronic component and the third electronic component onto the insulating substrate.

5. The power module package of claim 4, wherein the first electronic component and the third electronic component are both gallium nitride dies, and orthogonal projections of the driving components onto the insulating substrate respectively overlap orthogonal projections of source electrodes and gate electrodes of the gallium nitride dies onto the insulating substrate.

6. The power module package of claim 2, further comprising a third electronic component, a fourth electronic component, and a fifth electronic component, each of the first electronic component and the third electronic component being a low voltage metal-oxide-semiconductor transistor disposed on the top surface of the conductive layer, both the second electronic component and the fourth electronic component being gallium nitride dies disposed on the bottom surface of the insulating substrate, the fifth electronic component being a capacitor disposed on the top surface of the conductive layer, wherein the second electronic component and the fourth electronic component are connected to the conductive layer in the first openings, and orthogonal projections of the low voltage metal-oxide-semiconductor transistors onto the insulating substrate respectively overlap orthogonal projections of source electrodes of the gallium nitride dies corresponding to the low voltage metal-oxide-semiconductor transistors onto the insulating substrate.

7. The power module package of claim 6, further comprising two driving components for respectively driving the low voltage metal-oxide-semiconductor transistors.

8. The power module package of claim 2, wherein the first electronic component is a low voltage metal-oxide-semiconductor transistor, the second electronic component is a gallium nitride die, and an orthogonal projection of the low voltage metal-oxide-semiconductor transistor onto the insulating substrate overlaps an orthogonal projection of a source electrode of the gallium nitride die onto the insulating substrate.

9. The power module package of claim 1, wherein the conductive layer has at least one concave portion, and the first electronic component is disposed in the concave portion.

10. The power module package of claim 1, wherein the conductive layer is a copper layer.

11. The power module package of claim 1, further comprising an encapsulating plastic completely or partially wrapping the single-layered circuit board and the first electronic component disposed on the single-layered circuit board.

12. The power module package of claim 11, wherein a portion of the first electronic component is exposed from the encapsulating plastic, and the power module package further comprises a heat dissipation component disposed on the first electronic component.

13. The power module package of claim 12, further comprising a heat conductive material disposed between the heat dissipation component and the first electronic component.

14. The power module package of claim 1, wherein the insulating substrate comprises a plurality of second openings to expose the conductive layer, the power module package further comprises a plurality of connecting structures disposed in the second openings on the bottom surface of the insulating substrate and are connected to the conductive layer in the second openings, or the plurality of connecting structures are directly disposed on the top surface of the conductive layer.

15. The power module package of claim 14, further comprising an isolation layer covering the bottom surface of the insulating substrate, the isolation layer having a plurality of third openings, each of the first openings and the second openings and the third opening corresponding to the each of the first openings and the second openings communicating with each other vertically.

16. The power module package of claim 14, wherein the connecting structures are solder balls or pins.

17. The power module package of claim 1, further comprising an insulating layer disposed on the conductive layer, the insulating layer comprising a plurality of fourth openings, wherein the first electronic component is connected to the conductive layer via the fourth openings.

18. The power module package of claim 1, further comprising a isolation layer covering part of the top surface of the conductive layer.

* * * * *